US006045747A

United States Patent [19]

Holm

[11] Patent Number: 6,045,747

[45] Date of Patent: Apr. 4, 2000

[54] METHOD OF PRODUCING AN LC-CIRCUIT

[75] Inventor: Jens Peter Holm, Rungsted Kyst, Denmark

[73] Assignee: The Whitaker Corporation, Wilmington, Del.

[21] Appl. No.: 09/158,429

[22] Filed: Sep. 21, 1998

Related U.S. Application Data

[63] Continuation-in-part of application No. PCT/DK97/00124, Mar. 21, 1997, and application No. PCT/DK97/00125, Mar. 21, 1997.

[30] Foreign Application Priority Data

Mar. 22, 1996 [DK] Denmark ................................ 0335/96
Mar. 22, 1996 [DK] Denmark ................................ 0336/96

[51] Int. Cl.[7] ............................ C04B 35/64; C04B 37/00

[52] U.S. Cl. .......................... 264/618; 264/615; 264/620; 156/89.12; 156/89.14; 156/89.16; 156/89.17

[58] Field of Search ............................. 156/89.14, 89.12, 156/89.16, 89.17; 264/615, 620, 618

[56] References Cited

U.S. PATENT DOCUMENTS

| | | | |
|---|---|---|---|
| 4,322,698 | 3/1982 | Takahashi et al. | 333/184 |
| 4,746,557 | 5/1988 | Sakamoto et al. | 428/138 |
| 4,990,202 | 2/1991 | Murata et al. | 156/89.12 |
| 5,006,182 | 4/1991 | Gantzhorn et al. | 156/89.12 |
| 5,197,170 | 3/1993 | Senda et al. | 156/89.12 |
| 5,337,026 | 8/1994 | Borchelt et al. | 333/150 |

FOREIGN PATENT DOCUMENTS

| | | |
|---|---|---|
| 0622897 A2 | 4/1994 | European Pat. Off. . |
| 0449473 B1 | 12/1995 | European Pat. Off. . |
| 0602666 B1 | 9/1998 | European Pat. Off. . |

OTHER PUBLICATIONS

Patent Abstract of Japan, 7–106200.

*Primary Examiner*—James Derrington

[57] ABSTRACT

A method is provided of producing an LC-circuit in form of a single component, in which the inductor and capacitor elements are arranged atop one another, and where the inductor elements are formed by ferromagnetic zones made of layers (6,8) of ferrite of a high permeability, and between which electrode layers (7) are provided, and where the capacitor elements are formed by dielectric zones made of layers (9) of dielectric with electrode layers (4,5) on both sides, said inductor and capacitor elements being produced by way of tape- or thick-film technology. According to the invention, the capacitor elements are initially provided and being subjected to a sintering at a relatively high temperature, whereafter the inductor elements (6,7,8) are applied and a sintering is performed at a considerably low temperature. In this manner undesired reactions are avoided between the two zones.

4 Claims, 2 Drawing Sheets

METHOD OF PRODUCING AN LC-CIRCUIT

CONTINUATION DATA

The present application is a Continuation In Part of PCT/DK97/00124 filed Mar. 21, 1997 claiming priority from Danish application 0335/96 Mar. 22, 1996 and of PCT/DK97/00125 filed Mar. 21, 1997 claiming priority of Danish application number 0336/96 filed Mar. 22, 1996.

FIELD OF THE INVENTION

The invention relates to a method of producing an LC-circuit in the form of a single component, where the inductor and capacitor elements are arranged atop one another, and where the inductor elements are formed by ferromagnetic zones composed of layers of ferrite of a high permeability, electrode layers being provided between said layers of ferrite, and where the capacitor elements are formed by dielectric zones made of dielectric paste with electrode layers on both sides, said inductor and capacitor elements being produced by means of tape or thick-film technology or combinations thereof.

BACKGROUND OF THE INVENTION

The use of ferromagnetic materials for structuring chip components comprising both inductors and capacitors has previously been limited by the difficulty in using ferromagnetic materials in connection with dielectric materials. The inductors are often made of a ferrite and are used by way of known printing methods for structuring layer structures including internal conducting paths. These inductors have low inductances due to the low permeability of the ferromagnetic material. EP-PS No. 297 565 discloses for instance a ferromagnetic material of relatively low permeability caused by a very small granular size and a high content of glass. Attempts have be made to obtaining a higher permeability by raising the sintering temperature or increasing a sintering period, but from a productional point of view such procedures are disadvantageous or necessitate the use of cost-intensive electrode materials, such a Pd. Thus the material described in EO-PS No. 297 565 requires a sintering period of 30–220 min., which makes a production under usual thick-film conditions difficult. Furthermore, the final components have a relatively poor mechanical strength.

Moreover chip components comprising both inductors and capacitors suffer from delamination and distortion at the interface zone between the ferromagnetic and the dielectric zones. Chip components comprising both inductors and capacitors are furthermore encumbered with problems due to reactions at the interface between the ferromagnetic and the dielectric zones, whereby the characteristics of these materials are deteriorated.

These problems can be set right by the ferromagnetic zones being separated from the dielectric zones of the capacitors by means of a blocking layer, cf. Danish Patent Application No. 908/91.

BRIEF DESCRIPTION OF THE INVENTION

Such an additional blocking layer should, however, be avoided, and a method of the above type is according to the invention characterized by initially providing the capacitor elements, which are sintered at a relatively high temperature, whereafter the inductor elements are applied followed by a sintering at a considerably lower temperature. In this manner undesired reactions are avoided between the two zones. Furthermore you have a free hand concerning the choice of dielectrics for the capacitor elements in such a manner that desired properties, such as high dielectric constants, i.e. high capacity values, in the same number of layers can be optimized.

According to a first embodiment, the capacitor elements are provided by means of dielectric having $\epsilon_R<250$, such as a ceramic powder of the type TAM NPO CL750, which is mixed with a binder and cast in thin layers, whereafter an electrode material is applied. In this manner the capacitor elements obtain particularly high dielectric constants, i.e. high capacity values.

According to a second embodiment, the capacitor elements are provided by means of dielectric having $\epsilon_R>250$, such as a ceramic powder of the type TAM X7R 212L, which is mixed with a binder and cast in thin layers, whereafter an electrode material is applied. The resulting LC-circuit presents particularly high capacity values for the same number of layers. In addition, low cut-off frequencies can thereby be obtained.

BRIEF DESCRIPTION OF THE DRAWINGS

The invention is explained in greater detail below with reference to the accompanying drawings, in which.

DETAILED INVENTION OF THE INVENTION

Figure 1:
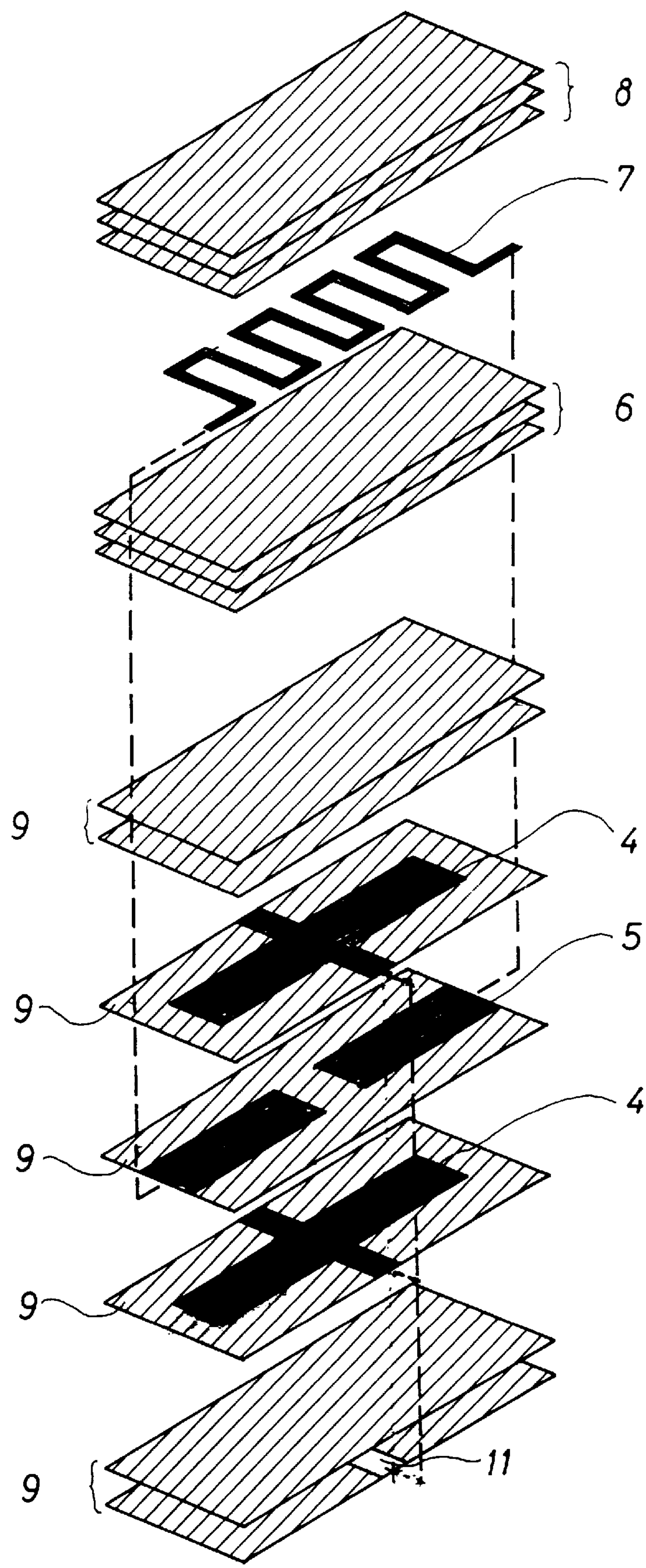
FIG. 1 is an exploded view of a multilayer LC-circuit according to the invention.

The multilayer LC-circuit of FIG. 1 comprises at least one ferromagnetic and at least one dielectric zone forming inductors and capacitors, respectively. Previously, it has been difficult to use ferromagnetic materials in connection with dielectric materials. According to the invention, the process conditions have been divided such that undesired reactions between the materials have been avoided.

Figure 2:
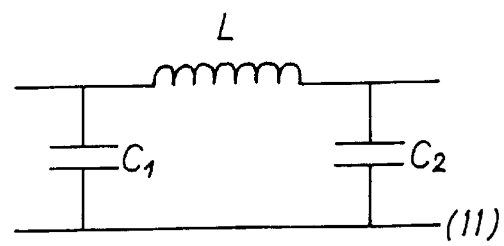
FIG. 2 illustrates an equivalence diagram of the LC-circuit.
Figure 3:
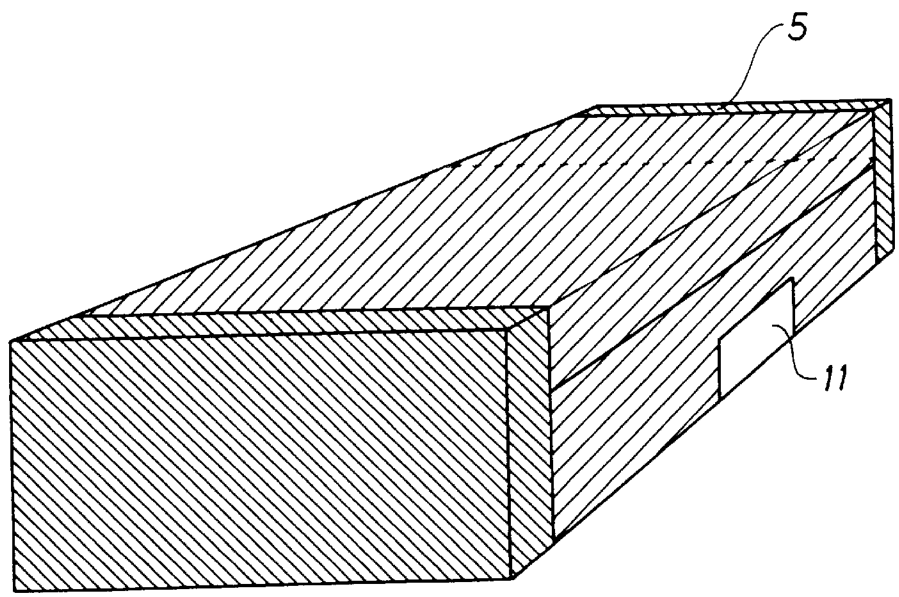
FIG. 3 shows the final LC-circuit in the form of a single component.

Examples are described below where the principle is used for the productions of multilayer Pi-filters containing two capacitors $C_1$, $C_2$ and one inductor (L—cf. FIG. 2). The two capacitors $C_1$, $C_2$ are produced by means of multilayer tape, whereas the inductor L is produced by way of serigraphy technology.

In a first example the process steps are as follows:

a) A ceramic powder for instance of the type TAM NPO is mixed with a PVB binder for instance of the type MSI B73221 in the ratio of 55 weight % of ceramic powder to 45 weight % of binder in a container with zirconium balls for about 16 hours. The mixture is then cast in thin layers of a thickness of about 35–40 μm on a carrier film, such as a Mylar film. The ceramic layers are removed from the carrier film and adhered to frames, cf. The article "Production of ceramic multilayer chip-capacitor" by Ole Pedersen, Ferroperm in Elektronik 1,1983), whereafter the ceramic tape on the inner side is applied an electrode material, which is for instance Gwent C30111D1 (70% AG, 30% Pd). After airdrying of the applied electrode, the layers are individually punched in a matrix. Then the layers are laminated together into a block (at a pressure of about 3000 psi and a temperature of about 70° C.). Then the binder is slowly burnt off in the finished multilayer block. The block is then sintered in an oven at a temperature of about 1100° C. for about 2 hours.

b) The used ferrite paste is for instance composed of $L_{i0.5\,(1+t-z-c)}$, $Zn_z$, $Mn_m$, $Ti_t$, $Co_c$, $Fe_{(1-0.2z-0.6t-0,\ 4m-0,\ 2c-\epsilon)}$, where $0 \leqq t \leqq 0.2; 0.2 \leqq x \leqq 0.5; 0.2 \leqq n \leqq 0.4;$ $1.02 \leqq c \leqq 0.05$, and $\epsilon$ are of the magnitude 0.06.

c) On the rear side of the ceramic substrate, electrodes 4 of Ag/Pd/Pt, such as DuPont, are serigraphed which is to serve as frame termination. The internal frame electrodes are connected later on to the frame termination by means of rim terminations. The frame termination is burnt on at about 750° C. Then the substrate is turned, and a plurality of ferrite layers 6 is serigraphed until the thickness is about 0.25 mm. Internal silver electrodes and necessary cutting marks are serigraphed twice, whereafter a plurality of ferrite layers 8 are again serigraphed until the total thickness of the ferrite layers is about 0.5 mm. The entire structure is then sintered at a temperature, which is below the melting point of silver, such as 910° C., for one to two hours.

d) the ceramic substrate with the applied and sintered ferrite material is adhered to a steel plate with a glass base by means of shellac. On a cutting machine with diamant blades, a cutting is initially carried out in one direction through cutting masks applied together with silver electrodes. The plates are then turned 90°, and a cutting is performed in the opposite direction. The items cut out are washed in ethanol and subjected to a rim-end termination by means of Ag/Pd/Pt termination paste of the type DuPont 4933 D.

The ceramic material is typically barium titanate-based, such as;

TAMTRON CL750 product No. 58221

TAMTRON COG150l product No. 52622

TAMTRON COG600L product No. 52601 i.e. materials sintering at temperatures above 1000° C. Other ceramic materials can be used.

As ferrite materials is used $LiMe_2O_4$, such as;

FERROPERM A/S: L34 (lithium spinel ferrite)

FERROPERM A/S: L48 i.e. materials sintering at temperatures below 960° C. Other ferrite materials can, however, also be used.

As conducting material in the capacitor elements is used Ag/Pd, such as;

GWENT: C30111D1 70 Ag/30 Pd

ESL: 9637-B

As conducting material in the inductor elements is used Ag/Pd, such as;

DuPont: 6160 (100% Ag)

ESL: 9912-f (100% Ag)

ESL: 9990 (100% Ag)

Other conducting materials in the inductor elements can, however, also be used, such as gold. The conductor paths 7 can for instance be meandershaped, cf. FIG. 1.

The inductor L is typically of 100 nH whereas the capacitors $C_1$, $C_2$ typically are 0 2×1 nF. FIG. 1 shows further the interconnections between the components.

During the production, a temperature difference must apply by the processes at the capacitor elements and the inductor elements, respectively, of at least 50° C. In this manner undesired reactions are avoided between the two zones. The temperature difference is typically 200° C.

In a second example the process steps are as follows:

a) A ceramic powder for instance of the type X7R 212L is mixed with a PVB binder for instance of the type MSI B73221 in the ratio of 55 weight % of ceramic powder to 45 weight % of binder in a container with zirconium balls for about 16 hours. The mixture is then cast in thin layers of a thickness of about 35–40 μm on a carrier film, such as a Mylar film. The ceramic layers are removed from the carrier film and adhered to frames, cf. The article "Production of ceramic multilayer chipcapacitors" by Ole Pedersen, Ferroperm in Elektronik 1, 1983), whereafter the ceramic tape on the innerside is applied an electrode material, which is for instance Gwent C30111D1 (70% AG, 30% Pd). After airdrying of the applied electrode, the layers are individually punched in a matrix. Then the layers are laminated together into a block at a pressure of about 3000 psi and a temperature of about 70° C. Subsequently, a slow burning off of the binder in the final multilayer block is performed. The block is then sintered in an oven at a temperature of about 1100° C. for about 2 hours.

The used ferrite paste is for instance composed of $L_{i0.5\,(1+t-z-c)}$, $Zn_z$, $Mn_m$, $Ti_t$, $CO_c$, $Fe_{(1-0.2z-0.6t-0,\ 4m-0,\ 2c-\epsilon)}$, where $0 \leqq t \leqq 0.2; 0.2 \leqq x \leqq 0.5; 0.2 \leqq n \leqq 0.4;$ $1.02 \leqq c \leqq 0.05$, and $\epsilon$ are of the magnitude 0.06.

On the rear side of the ceramic substrate, electrodes 4 of Ag/Pd/Pt are serigraphed, such as DuPont, which is to serve as frame termination. The internal frame electrodes are connected later on to the frame termination by means of rim terminations. The frame termination is burnt on at about 750° C. Then the substrate is turned, and a plurality of ferrite layers 6 is serigraphed until the thickness is about 0.25 mm. Internal silver electrodes and necessary cutting marks are serigraphed twice, whereafter a plurality of ferrite layers 8 are again serigraphed until the total thickness of the ferrite layers is about 0.5 mm. The entire structure is then sintered at a temperature, which is below the melting point of silver, such as 910° C., for one to two hours.

The ceramic substrate with the applied and sintered ferrite material is adhered to a steel plate with a glass base by means of shellac. By means of a diamant cutting machine a cutting is initially carried out in one direction through some cutting masks applied together with the silver electrodes, whereafter the plates are turned 90° and a cutting is performed in the opposite direction. The items cut out are washed in ethanol and subjected to a rim-end termination by means of Ag/Pd/Pt termination paste of the type DuPont 4933 D.

Covering power:

The ceramic material is typically barium titanate-based, such as;

TAMTRON X7R162L product No. 52563

TAMTRON X7R212L product No. 52675

TAMTRON X7R262L product No. 52625

TAMTRON X7R4221 product No. 52628 i.e. materials sintering at temperatures above 1000° C. Other ceramic materials can be used.

As ferrite material is used $LiMe_2O_4$, such as;

FERROPERM A/S: L34 (LITHIUM SPINEL FERRITE)

FERROPERM A/S: L48 i.e. materials sintering at temperatures below 960° C. Other ferrite materials can, however, also be used.

As conducting material in the capacitor elements is used Ag/Pd, such as;

Gwent: C30111D1 70 Ag/30 Pd

ESL: 9637-B

As conducting material in the inductor elements is used Ag/Pd, such as;

DuPont: 6160 (100% Ag)

ESL: 9912-f (100% Ag)

ESL: 9990 (100% Ag)

Other conducting materials in the inductor elements can, however, also be used, such as gold. The conductor paths 7 can for instance be meander-shaped, cf. FIG. 1.

The inductor L is typically of 100 nH whereas the capacitors $C_1$,$C_2$ typically are 0 2×10 nF. FIG. 1 illustrates furthermore the interconnections of the components.

During the production, a temperature difference must apply by the processes at the capacitor elements and the inductor elements, respectively, of a least 50° C. In this manner undesired reactions are avoided between the two zones.

What is claimed is:

1. A method of producing an L-C circuit in the form of a single component, in which the inductor and the capacitor elements are arranged atop one another, and where the inductor elements are formed by ferro-magnetic zones composed of layers of ferrite of a high permeability, and where electrode layers are provided between said ferrite layers, and where the capacitor elements are formed by dielectric zones made of layers of dielectric with electrode layers on both sides, said inductor and capacitor elements being produced by way of tape or thick-film technology or combinations thereof, and further comprising the steps of:

sintering the capacitor elements at a first sintering temperature, applying the inductor elements to the sintered capacitor elements to prepare a structure, and then sintering the structure at a second sintering temperature that is lower than the first sintering temperature.

2. A method as claimed in claim 1, wherein the step of sintering the structure at a second sintering temperature further comprises the step of: sintering the structure at the second sintering temperature, with at least 50° C. temperature difference between the first and second sintering temperatures.

3. A method as claimed in claim 1, wherein the step of sintering the capacitor elements at a first sintering temperature, further comprises the step of:

sintering the capacitor elements at a temperature above 1000° C.; and the step of sintering the structure at a second sintering temperature, further comprises the step of;

sintering the structure at a second sintering temperature below about 960° C.

4. A method as recited in claim 1 wherein the step of sintering the capacitor elements at a first sintering temperature, further comprises the step of:

sintering the capacitor elements of a dielectric of $\epsilon_R$>250 in the form of a ceramic powder, mixed with a binder and cast in thin layers.

* * * * *